United States Patent
Kusuda et al.

(10) Patent No.: US 10,756,676 B2
(45) Date of Patent: Aug. 25, 2020

(54) AMPLIFIER SYSTEMS FOR DRIVING A WIDE RANGE OF LOADS

(71) Applicant: Analog Devices Global Unlimited Company, Hamilton (BM)

(72) Inventors: Yoshinori Kusuda, San Jose, CA (US); Simon Nicholas Fiedler Basilico, San Francisco, CA (US); Sean Patrick Kowalik, Chelmsford, MA (US); Joseph Leandro Balais Peje, Manila (PH); Michael C. W. Coln, Lexington, MA (US)

(73) Assignee: Analog Devices Global Unlimited Company, Hamilton (BM)

( * ) Notice: Subject to any disclaimer, the term of this patent is extended or adjusted under 35 U.S.C. 154(b) by 127 days.

(21) Appl. No.: 16/162,858

(22) Filed: Oct. 17, 2018

(65) Prior Publication Data
US 2020/0127610 A1    Apr. 23, 2020

(51) Int. Cl.
*H03F 1/14*   (2006.01)
*H03F 1/02*   (2006.01)
(Continued)

(52) U.S. Cl.
CPC ............ *H03F 1/0233* (2013.01); *H03F 3/21* (2013.01); *H03F 3/45488* (2013.01);
(Continued)

(58) Field of Classification Search
CPC ...... H03F 1/0233; H03F 3/45488; H03F 3/21; H03F 3/217; H03F 3/2173; H03F 3/2171; H03F 2200/351; H03F 3/72; H03F 1/0277; H03F 3/211; H03F 3/602; H03F 3/604; H03F 1/0288; H03G 1/0088
(Continued)

(56) References Cited

U.S. PATENT DOCUMENTS 4,396,986 A * 8/1983 Salesky ................. H02M 3/157
                                                    324/76.11
5,006,817 A    4/1991 Babanezhad
(Continued)

FOREIGN PATENT DOCUMENTS

CN    105406829        3/2016
EP    1111493 A1       6/2001
(Continued)

OTHER PUBLICATIONS

Analog Devices Inc., AD5933 Data Sheet—1MSPS, 12-Bit Impedance Converter, Network Analyzer, 2005, 40 pgs.
(Continued)

*Primary Examiner* — Khanh V Nguyen
(74) *Attorney, Agent, or Firm* — Knobbe, Martens, Olson & Bear, LLP (57) ABSTRACT

Amplifier systems for driving a wide range of loads are provided herein. In certain embodiments, an amplifier system includes a voltage output amplifier and a current output amplifier that are electrically coupled in parallel with one another between an input terminal and an output terminal. The amplifier system further includes a control circuit operable to control whether or not the voltage output amplifier and/or current output amplifier drive the output terminal.

20 Claims, 8 Drawing Sheets

(51) Int. Cl.
*H03F 3/21* (2006.01)
*H03F 3/45* (2006.01)
*H03F 3/60* (2006.01)
*H03F 3/72* (2006.01)

(52) U.S. Cl.
CPC ............ *H03F 1/0288* (2013.01); *H03F 3/602* (2013.01); *H03F 3/72* (2013.01)

(58) Field of Classification Search
USPC .................. 330/51, 124 R, 207 A, 251, 295
See application file for complete search history.

(56) References Cited

U.S. PATENT DOCUMENTS

| | | | |
|---|---|---|---|
| 5,686,821 A | | 11/1997 | Brokaw |
| 6,298,466 B1 | | 8/2001 | Dasgupta |
| 6,366,070 B1 | | 4/2002 | Cooke et al. |
| 6,518,737 B1 | | 2/2003 | Stanescu et al. |
| 6,556,083 B2 | | 4/2003 | Kadanka |
| 6,657,487 B2 | * | 12/2003 | Lauffenburger ........ H03F 1/303 330/9 |
| 7,091,785 B2 | | 8/2006 | Deval et al. |
| 7,843,180 B1 | | 11/2010 | Cilingiroglu |
| 7,973,596 B2 | * | 7/2011 | Eschauzier ............. H03F 3/347 330/51 |
| 8,890,610 B2 | | 11/2014 | Brantley et al. |
| 8,988,148 B2 | | 3/2015 | Jenkins et al. |
| 9,608,579 B2 | | 3/2017 | Castro |
| 9,614,481 B2 | | 4/2017 | Ivanov |
| 9,733,283 B2 | | 8/2017 | Harriman |
| 2014/0218112 A1 | | 8/2014 | Brantley et al. |
| 2017/0093339 A1 | | 3/2017 | Wu et al. |

FOREIGN PATENT DOCUMENTS

| | | |
|---|---|---|
| JP | 2002057534 | 2/2002 |
| WO | WO 96/41248 | 12/1996 |
| WO | WO 02/063761 A2 | 8/2002 |
| WO | WO 2017/053967 | 3/2017 |

OTHER PUBLICATIONS

Dixit et al., "Design and Imitation of OTA for High Voltage Gain by Using CMOS in 0.90 nm Technology," Imperial Journal of Interdisciplinary Research, vol. 3, Issue 1, pp. 2423-2428, 2017.
Jung, "OP Amp Applications Handbook, Analog Devices," pp. 6.57-6.59, 2005.
Leung et al., "Analysis of Multistage Amplifier-Frequency Compensation," IEEE Transactions on Circtuis and Systems—I: Fundamental Theory and Applications, vol. 48, No. 9, Sep. 2001, pp. 1041-1056.
Liao et al., "Single Capacitor with Embedded Current Amplifier Compensation for Three-stage Amplifier with Large Capacitive Loads," IEICE Electronics Express, 13(1) Dec. 2015, 4 pages.
Peng, "Impedance Adapting Compensation for Low-Power Multistage Amplifiers," IEEE Journal of Solid-State Circuits, col. 46,No. 2, Feb. 2011, pp. 445-451.
Peng, et al., "Transconductance with Capacitances Feedback Compensation for Multistage Amplifiers," IEEE Journal of Solid State Circuits, col. 40, Issue 7, Jul. 2005, pp. 143-146.
Roberge, "Operational Amplifiers" Theory and Practice, Massachusetts Institute of Technology, 1975, in 28 pages.
Tam, et al., "Design Methodology of Double Nulling Resistors Nested-Miller Compensation of Multistage Amplifier," Solid State Electronic Letters, 2018, in 10 pages.
Thandri, et al., "A Robust Feedforward Compensation Scheme for Multistage Operational Transconductance Amplifiers with No Miller Capacitors," IEEE Journal of Solid-State Circtuis, vol. 38, No. 2, pp. 237-243, Feb. 2003.
Yu, et al.,"A Compact Operational Amplifier with Load-Insensitive Stability Compensation for High-Precision Transducer Interface," Sensors, 18, 393, 2018, 22 pgs.
Extended European Search Report for International Application No. 19202858.7 dated Feb. 13, 2020 in 8 pages.

* cited by examiner

AMPLIFIER SYSTEMS FOR DRIVING A WIDE RANGE OF LOADS

FIELD OF THE DISCLOSURE

Embodiments of the invention relate to electronic systems, and more particularly, to amplifiers.

BACKGROUND

Certain electronic devices employ amplifiers for processing signals. When operating open loop, such amplifiers receive an input signal and generate an output signal having a gain in comparison to the input signal. Examples of amplifiers include, but are not limited to, operational amplifiers, transimpedance amplifiers, and transconductance amplifiers. Certain amplifiers are implemented in a multi-stage configuration to enhance gain and/or performance thereof.

SUMMARY OF THE DISCLOSURE

Amplifier systems for driving a wide range of loads are provided herein. In certain embodiments, an amplifier system includes a voltage output amplifier and a current output amplifier that are electrically coupled in parallel with one another between an input terminal and an output terminal. The amplifier system further includes a control circuit operable to control whether or not the voltage output amplifier and/or current output amplifier drive the output terminal. Implementing the amplifier system in this manner allows the amplifier system to drive a wide range of loads. For instance, the voltage output amplifier can be suitable for driving a resistive load, while the current output amplifier can be suitable for driving a capacitive load. Moreover, for certain types of loads, such as those including a combination of resistance and capacitance, both the voltage output amplifier and the current output amplifier can be enabled to drive the load.

Thus, including the parallel combination of the voltage output amplifier and the current output amplifier enhances flexibility of the amplifier system in driving a wide range of possible types of load. Thus, rather than needing a dedicated part (for instance, a particular chip design) for a particular type of load, the amplifier systems herein can be incorporated on a semiconductor chip suitable for driving loads of a range of different impedances. The amplifier systems herein can be used in a wide range of applications, including, but not limited to, impedance measurement. For example, an amplifier system can be used to bias and/or measure a sensor's voltage and/or current, thereby providing precision control of sensors used to detect various changes in environmental quantities or conditions.

In one aspect, an amplifier system with controllable load driving characteristics is provided. The amplifier system includes an output terminal configured to connect to a load, a first output switch and a second output switch, a voltage output amplifier having a voltage output electrically connected to the output terminal through the first output switch, a current output amplifier having a current output electrically connected to the output terminal through the second output switch, and a control circuit configured to control the first output switch to selectively connect the voltage output of the voltage output amplifier to the output terminal, and to control the second output switch to selectively connect the current output of the current output amplifier to the output terminal.

In another aspect, an electronic module with controllable load driving characteristics is provided. The electronic module includes a module substrate and an amplifier die attached to the module substrate. The amplifier die includes an output pin configured to provide an output signal to a load, a voltage output amplifier, a current output amplifier electrically connected in parallel with the voltage output amplifier, and a control circuit configured to control the amplifier die to selectively drive the output pin with the voltage output amplifier and to selectively drive the output pin with the current output amplifier.

In another aspect, a method of electronic amplification with controllable load driving characteristics is provided. The method includes receiving a control signal as an input to an amplifier system, the control signal indicating a selected mode of the amplifier system chosen from a plurality of modes including a first mode, a second mode, and a third mode. The method further includes controlling an output terminal of the amplifier system with a voltage output amplifier in response to the control signal indicating the selected mode is the first mode, controlling the output terminal with a current output amplifier in response to the control signal indicating the selected mode is the second mode, and controlling the output terminal with both the voltage output amplifier and the current output amplifier in response to the control signal indicating the selected mode is the third mode.

DETAILED DESCRIPTION OF EMBODIMENTS

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Amplifier systems for driving a wide range of loads are provided herein. In certain embodiments, an amplifier system includes a voltage output amplifier and a current output amplifier that are electrically coupled in parallel with one another between an input terminal and an output terminal. The amplifier system further includes a control circuit operable to control whether or not the voltage output amplifier and/or current output amplifier drive the output terminal.

Implementing the amplifier system in this manner allows the amplifier system to drive a wide range of loads. For instance, the voltage output amplifier can be suitable for driving a resistive load, and thus the voltage output amplifier can be enabled and the current output amplifier disabled when a resistor or other resistive load is coupled to the output terminal. Additionally, the current output amplifier can be suitable for driving a capacitive load, and thus the current output amplifier can be enabled and the voltage output amplifier disabled when a capacitor or other capacitive load is coupled to the output terminal. Moreover, for certain types of loads, such as those including a combination of resistance and capacitance, both the voltage output amplifier and the current output amplifier can be enabled to drive the load.

Thus, including the parallel combination of the voltage output amplifier and the current output amplifier enhances flexibility of the amplifier system in driving a wide range of possible types of load. Thus, rather than needing a dedicated part (for instance, a particular chip design) for a particular type of load, the amplifier systems herein can be incorporated on a semiconductor chip suitable for driving loads of a range of different impedances.

In certain implementations, the voltage output amplifier is implemented as an operational amplifier including two or more stages arranged in a cascade. For example, such a multi-stage operational amplifier includes an output stage that provides buffering to aid in driving a resistive load. The current output amplifier can be implemented in a wide variety of ways. In certain implementations, the current output amplifier is implemented as a transconductance amplifier having a single stage and a current output suitable for driving a capacitive load.

The amplifier systems herein operate stably when connected with negative feedback. For example, when driving a resistive load, the voltage output amplifier can be enabled to drive the resistive load without oscillation or other instability. Additionally, when driving a capacitive load, the current output amplifier can be enabled to drive the capacitive load without stability problems.

In contrast, an amplifier system with only a voltage output amplifier or only a current output amplifier can exhibit unstable behavior under certain load conditions. For instance, an operational amplifier can suffer from instability when driving a capacitive load and/or a transconductance amplifier can suffer from instability when driving a resistive load.

In certain implementations, the amplifier system includes input switches for selectively providing an input signal (for instance, an input voltage) received from the input terminal to an input of the voltage output amplifier and/or to an input of the current output amplifier. Furthermore, the amplifier system can include output switches for selectively connecting the output terminal to the voltage output of the voltage output amplifier and/or to the current output of the current output amplifier.

Implementing the amplifier system in this manner aids in decoupling an inactive amplifier from the input terminal and/or output terminal of the amplifier system. This in turn provides a number of advantages, including, but not limited to, inhibiting an inactive amplifier from impacting signaling, impedance matching, and/or other performance characteristics of the amplifier system.

To further enhance configurability, the amplifier system can be implemented with switches for selectively providing local feedback to the voltage output amplifier and/or to the current output amplifier. Additionally or alternatively, switches can be included for selectively inputting other signals to the voltage output amplifier and/or current output amplifier, including, but not limited to, input reference signals used for differential amplification.

In certain implementations, an unused amplifier is powered off to reduce power dissipation and/or heat generation. For example, when the voltage output amplifier is driving the output terminal, the current output amplifier can be powered down. Likewise, when the current output amplifier is driving the output terminal, the voltage output amplifier can be powered down.

In certain implementations, the voltage output amplifier and/or the current output amplifier has a power level (for instance, an amount of gain) that can be incrementally adjusted, for instance, between a lowest power level associated with disabled operation to a highest power level associated with high gain operation. By implementing the amplifier system in this manner, enhanced configurability is provided, thereby expanding a range of applications that the amplifier system can be deployed in. The power level of an amplifier can be controlled in a wide variety of ways, including, but not limited to, by adjustment of the amplifier's bias current.

In certain implementations, the amplifier system is coupled to an interface or bus, such as an inter-Integrated Circuit ($I^2C$) bus, a General Purpose Input Output (GPIO) bus, and/or other suitable interface. Additionally, the amplifier system's control circuit receives digital data from the bus used to control switch connectivity and/or state of the amplifiers. For example, the amplifier system can be fabricated on a semiconductor die or chip, and a user can digitally program a desired configuration or mode of the amplifier system using the bus. Implementing the amplifier system in this manner provides a convenient and flexible mechanism for user configurability.

The amplifier systems herein can be used in a wide range of applications, including, but not limited to, impedance measurement. For example, an amplifier system can be used to bias and/or measure a sensor's voltage and/or current, thereby providing precision control of sensors used to detect various changes in environmental quantities or conditions.

In certain implementations, a feedback system is included for controlling feedback provided from the output terminal to the input terminal of the amplifier system. In one example, the feedback system includes a feedback amplifier for coupling to the output terminal, an analog-to-digital converter (ADC) for generating digital input data based on an analog feedback signal from the feedback amplifier, a digital processing circuit for processing the digital input data to generate digital output data, and a digital-to-analog converter (DAC) for generating an analog feedback signal for the amplifier system based on the digital output data.

Implementing the feedback system in this manner can provide a number of advantages, including, but not limited to, enhanced flexibility in control of feedback over a range of different configurations of the amplifier system. For example, the digital processing circuit can provide digital integration, digital gain, and/or other desired digital processing to provide a type of feedback desirable for a particular configuration of the amplifier system chosen for a given application and/or type of load.

In certain implementations, a processing chip, such as a field-programmable gate array (FPGA) and/or microprocessor, is commonly packaged with an amplifier chip in a multi-chip module. The amplifier chip can include the configurable amplifier system thereon and at least one feedback amplifier for generating an analog feedback signal based on monitoring signaling conditions of an external load, such as a sensor external to the multi-chip module. Additionally, the analog feedback signal is processed by the processing chip to generate an input signal for the amplifier chip. Such multi-chip modules are suitable for deployment in a wide range of applications.

Figure 1A:
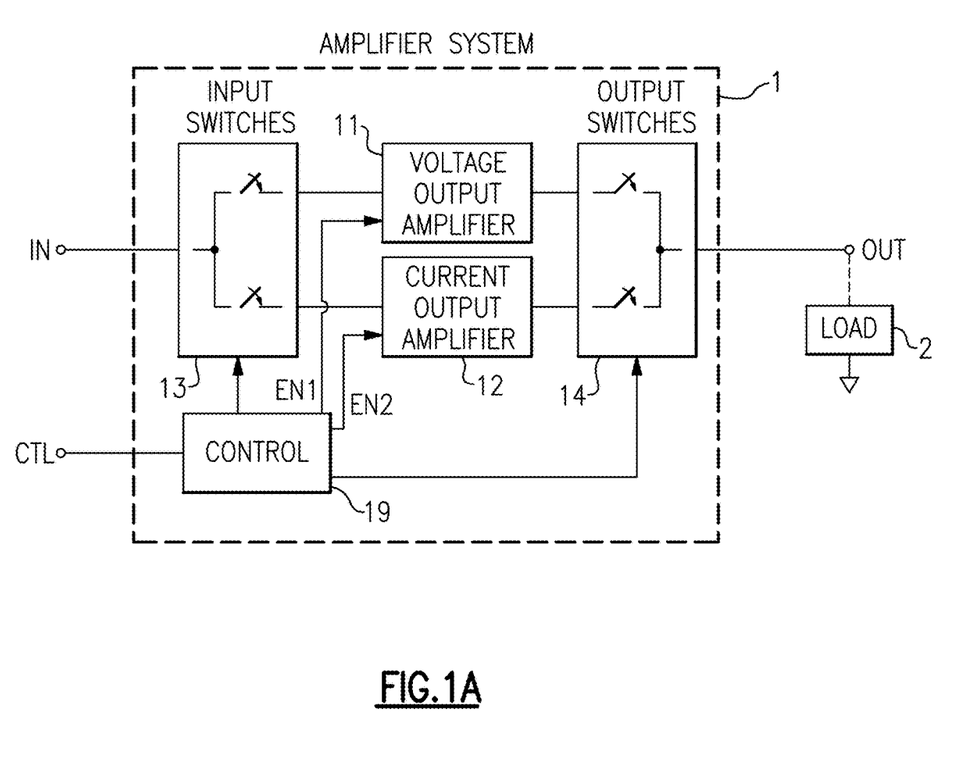
FIG. 1A is a schematic diagram of an amplifier system according to one embodiment.

FIG. 1A is a schematic diagram of an amplifier system 1 according to one embodiment. The amplifier system 1 includes a voltage output amplifier 11, a current output amplifier 12, input switches 13, output switches 14, and a control circuit 19. Although one embodiment of an amplifier system is shown in FIG. 1A, the teachings herein are applicable to amplifier systems implemented in a wide variety of ways.

With continuing reference to FIG. 1A, the amplifier system 1 includes an input terminal (IN) for receiving an input signal, such as input voltage. The amplifier system 1 further includes an output terminal (OUT) for driving a load 2. The amplifier system 1 also includes a control terminal (CTL) for receiving a control signal for selecting a particular configuration or mode of the amplifier system 1. In certain implementations, the control terminal corresponds to a serial interface or bus that receives digital data indicating the desired configuration.

The voltage output amplifier 11 and the current output amplifier 12 are electrically coupled in parallel with one another between the input terminal and the output terminal. Additionally, the input switches 13 are used to selectively provide the input signal to the voltage output amplifier 11 and/or the current output amplifier 12 for amplification. Furthermore, the output switches 14 are used to selectively connect the voltage output amplifier's voltage output to the output terminal and/or the current output amplifier's current output to the output terminal.

As shown in FIG. 1A, the control circuit 19 controls a state of the output switches 14 to control whether or not the voltage output amplifier 11 and/or the current output amplifier 12 drive the output terminal. The selection of active amplifier(s) that drive the output terminal is chosen based on the control signal received by the control circuit 19. Accordingly, amplifier circuitry suitable for a particular type of load 2 can be selected. The selection of active amplifier(s) can be chosen based on a number of factors, such as the type of load and/or to maintain stability when operated with feedback. For instance, the selection can be based on the amount of resistance, capacitance, and/or inductance of the load 2.

In the illustrated embodiment, the control circuit 19 also controls a state of the input switches 13 to control whether or not the voltage output amplifier 11 and/or the current output amplifier 12 receives the input signal for amplification. Implementing the amplifier system 1 in this manner can enhance performance, for instance, by reducing power dissipation and/or preventing an inactive amplifier from parasitically loading the input terminal and impacting input matching.

With continuing reference to FIG. 1A, the control circuit 19 provides a first enable signal (EN1) to the voltage output amplifier 11 and a second enable signal (EN2) to the current output amplifier 12. By implementing the control circuit 19 in this manner, the control circuit 19 can advantageously power down the voltage output amplifier 11 and/or the current output amplifier 12 when a particular amplifier is not in use.

Figure 1B:
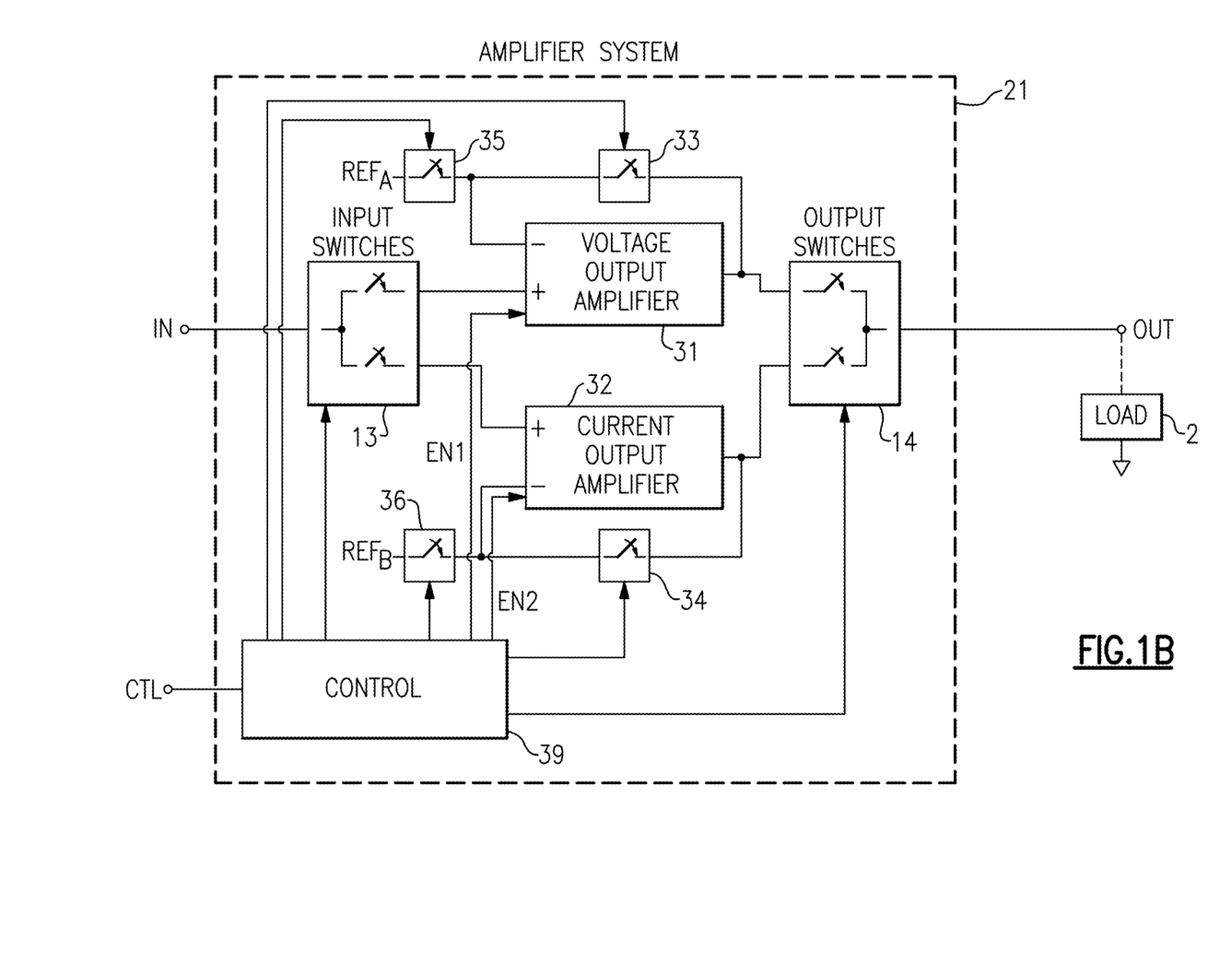
FIG. 1B is a schematic diagram of an amplifier system according to another embodiment.

FIG. 1B is a schematic diagram of an amplifier system 21 according to another embodiment. The amplifier system 21 of FIG. 1B includes input switches 13, output switches 14, a voltage output amplifier 31, a current output amplifier 32, a first feedback switch 33, a second feedback switch 34, a first auxiliary input switch 35, a second auxiliary input switch 36, and a control circuit 39. Although another embodiment of an amplifier system is shown in FIG. 1B, the teachings herein are applicable to amplifier systems implemented in a wide variety of ways.

The amplifier system 21 of FIG. 1B is similar to the amplifier system 1 of FIG. 1A, except the amplifier system 21 of FIG. 1B illustrates an implementation with additional switches and in which the voltage output amplifier 31 and the current output amplifier 32 each have a differential input with a positive or non-inverting input (+) and a negative or inverting (−) input.

In the illustrated embodiment, the input switches 13 are used to selectively connect the input terminal (IN) to the non-inverting input of the voltage output amplifier 31 and/or to the non-inverting input of current output amplifier 32.

With continuing reference to FIG. 1B, the amplifier system 21 has also been implemented with switches for controlling connectivity of the inverting inputs to the voltage output amplifier 31 and the current output amplifier 32.

For example, as shown in FIG. 1B, the first feedback switch 33 has been included for selectively connecting the voltage output of the voltage output amplifier 31 to the inverting input of the voltage output amplifier 31. Additionally, the first auxiliary input switch 35 has been included for selectively connecting the inverting input of the voltage output amplifier 31 to a first input reference (REF$_A$), which can be, for example, an input reference voltage such as ground. Furthermore, the second feedback switch 34 has been included for selectively connecting the current output of the current output amplifier 32 to the inverting input of the current output amplifier 32. Additionally, the second auxiliary input switch 36 has been included for selectively connecting the inverting input of the current output amplifier 32 to a second input reference (REF$_B$).

In the illustrated embodiment, the control circuit 39 receives a control signal used to control the state of the amplifier system's switches, including the input switches 13, the output switches 14, the first feedback switch 33, the second feedback switch 34, the first auxiliary input switch 35, and the second auxiliary input switch 36. Additionally, the control circuit 39 processes the control signal to selectively turn on or off the voltage output amplifier 31 and to selectively turn on or off the current output amplifier 32.

In certain implementations, a feedback impedance (for instance, a controllable resistor and/or controllable capacitor) is included in series with the first feedback switch 33 and/or a feedback impedance is included in series with the second feedback switch 34 to provide enhanced configurability over feedback. Additionally or alternatively, a feedback impedance is included in series with the first auxiliary input switch 35 and/or a feedback impedance is included in series with the second auxiliary input switch 36 to provide enhanced configurability.

Figure 2:
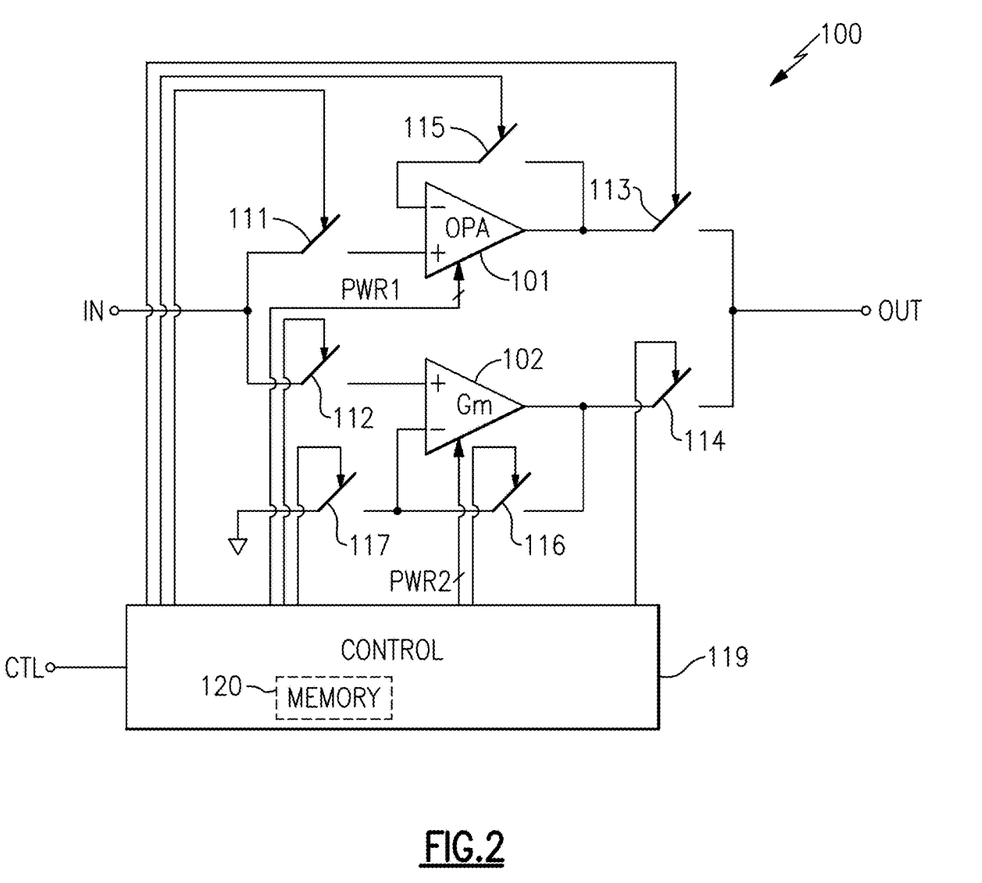
FIG. 2 is a schematic diagram of an amplifier system according to another embodiment.

FIG. 2 is a schematic diagram of an amplifier system 100 according to another embodiment. The amplifier system 100 includes an operational amplifier 101, a transconductance amplifier 102, a first input switch 111, a second input switch 112, a first output switch 113, a second output switch 114, a first feedback switch 115, a second feedback switch 116, an auxiliary input switch 117, and a control circuit 119. As shown in FIG. 2, the amplifier system 100 also includes an input terminal (IN) for receiving an input signal, an output terminal (OUT) for driving a load, and a control terminal (CTL) for receiving a control signal for configuring the amplifier system 100 in a selected mode.

Although FIG. 2 illustrates another embodiment of a configurable amplifier system for driving a variety of loads, the teachings herein are applicable to amplifier systems implemented in a wide variety of ways.

The first input switch 111 selectively connects a non-inverting input of the operational amplifier 101 to the input terminal, while the second input switch selectively connects the non-inverting input of the transconductance amplifier 102 to the input terminal. Additionally, the first output switch 113 selectively connects a voltage output of the operational amplifier 101 to the output terminal, while the second output switch 114 selectively connects the current output of the transconductance circuit 102 to the output terminal.

With continuing reference to FIG. 2, the first feedback switch 115 selectively connects the voltage output and the inverting input of the operational amplifier 101 to one another, while the second feedback switch 116 selectively connects the current output and inverting input of the transconductance amplifier 102 to one another. In this embodiment, the auxiliary input switch 117 selectively connects the inverting input of the transconductance amplifier 102 to a reference voltage (ground, in this example).

As shown in FIG. 2, the control circuit 119 controls a state of each of the switches 111-117. Thus, the control circuit 119 opens or closes the switches 111-117 to achieve a desired connectivity of the amplifier system 100 for a particular application. For instance, the selected configuration of the switches can be controlled based on the type of load coupled to the output terminal.

As shown in FIG. 2, the control circuit 119 provides a first power control signal (PWR1) to the operational amplifier 101, and provides a second power control signal (PWR2) to the transconductance amplifier 102. The power controls signals operate to select a particular power level or setting of the amplifiers. For instance, the power level can be incrementally adjusted between a low power level and a high power level. In certain implementations, the low power level is associated with disabled operation. Any number of power levels can be included. In one example, four or more power settings or modes are provided.

By providing control over power setting, enhanced configurability is provided. In certain implementations, power control signals are multi-bit digital signals. However, other implementations of power level control are possible, including, but not limited to, configurations using analog adjustment or tuning.

In certain implementations, the control circuit 119 controls the power levels of the operational amplifier 101 and the transconductance amplifier 102 by controlling the amount of bias current used by each amplifier. However, other schemes of power control are possible, including, but not limited to, implementations adjusting a number of active transistors, an internal load of an amplifier, and/or transistor geometry (for instance, transistor width used for amplification).

In the illustrated embodiment, the control circuit 119 includes a memory circuit 120, which includes digital data indicating a particular configuration of the amplifier system 100. Additionally, the memory circuit 120 receives the digital data from the control terminal CTL, which in certain implementations corresponds to a chip interface or bus.

In certain implementations, the memory circuit 120 includes a volatile memory that is programmed with the desired configuration of the amplifier system 100 using the control signal after power-up. For instance, a user of the amplifier system 100 can program the memory circuit 120 with data indicating the desired configuration of the amplifier system 100. However, other configurations are possible, such as implementations in which the memory circuit 120 includes a non-volatile memory (for instance, a flash memory, a read-only memory (ROM), fuses, anti-fuses, and/or a magnetic storage device) programmed with the configuration data. In such implementations, the memory circuit 120 can be programmed after manufacture with data associated with a particular target application or load.

Figure 3A:
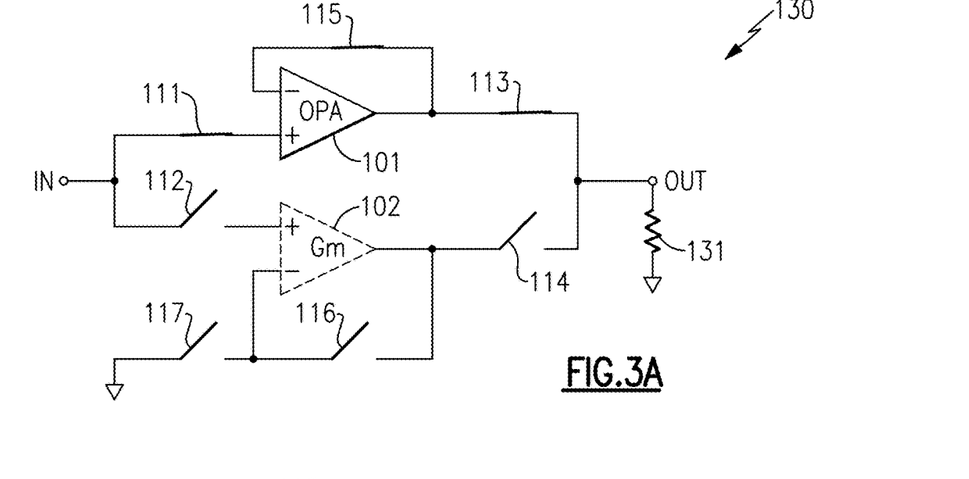
FIG. 3A is a schematic diagram illustrating a first example configuration of operation of the amplifier system of FIG. 2.
Figure 3B:
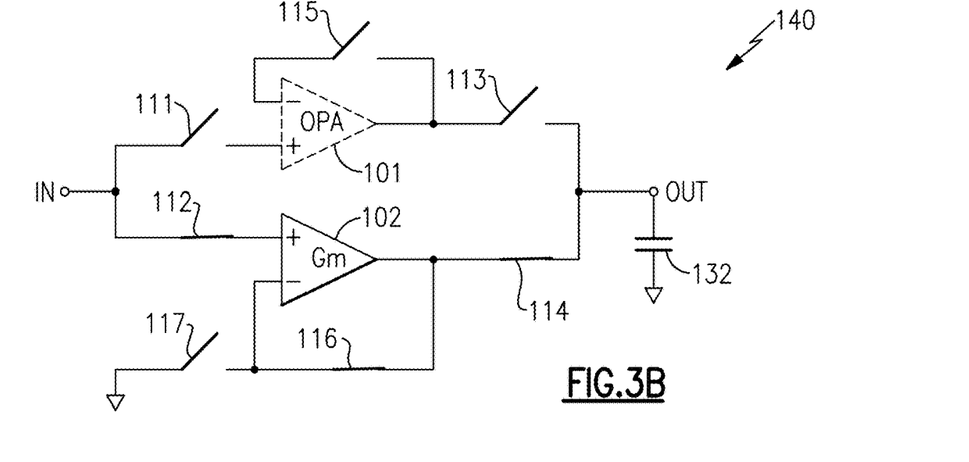
FIG. 3B is a schematic diagram illustrating a second example configuration of operation of the amplifier system of FIG. 2.
Figure 3C:
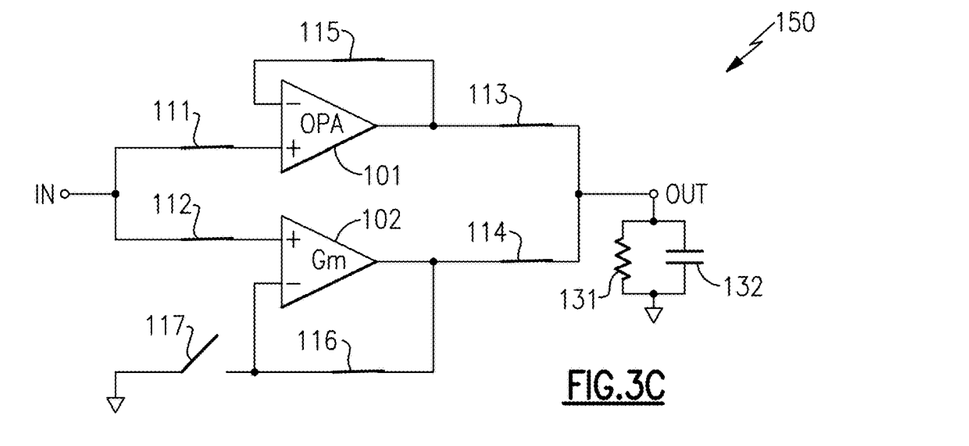
FIG. 3C is a schematic diagram illustrating a third example configuration of operation of the amplifier system of FIG. 2.

FIGS. 3A-3C illustrate various example configurations or modes of operation of the amplifier system 100 of FIG. 2. For clarity of the figures, the control circuit 119 of FIG. 2 and associated control signaling is not depicted. Although three example configurations of operation are shown, the amplifier system 100 can be configured in a wide variety of ways and/or operate with a wide variety of types of loads. Accordingly, other implementations are possible.

FIG. 3A is a schematic diagram illustrating a first example configuration 130 of operation of the amplifier system 100 of FIG. 2.

In this example, a resistor 131 is coupled to the output terminal (OUT). Additionally, the first input switch 111, the first output switch 113, and the first feedback switch 115 are closed, while the second input switch 112, the second output switch 114, the second feedback switch 116, and the auxiliary input switch 117 are opened. Furthermore, the operational amplifier 101 is enabled with a desired power setting using the first power control signal (PWR1) of FIG. 2. Additionally, the transconductance amplifier 102 is disabled by setting the second power control signal (PWR2) of FIG. 2 to a disabled setting (indicated by a dashed outline of the transconductance amplifier 102).

With continuing reference to FIG. 3A, the operational amplifier 101 is enabled and configured as a unity-gain buffer, in this example. Additionally, the transconductance amplifier 102 is powered down and disconnected. The voltage output of the operational amplifier 101 drives the resistor 131, and thus the voltage at the output terminal tracks the voltage of the input terminal (IN) with relatively high precision. For example, the operational amplifier 101 can include multiple stages for driving the resistor 131 with high DC gain and low DC error.

FIG. 3B is a schematic diagram illustrating a second example configuration 140 of operation of the amplifier system 100 of FIG. 2.

In this example, a capacitor 132 is coupled to the output terminal (OUT). Additionally, the first input switch 111, the first output switch 113, the first feedback switch 115, and the auxiliary input switch 117 are opened, while the second input switch 112, the second output switch 114, and the second feedback switch 116 are closed. Furthermore, the operational amplifier 101 is disabled (indicated by a dashed outline of the operational amplifier 101) using the first power control signal (PWR1) of FIG. 2. Additionally, the transconductance amplifier 102 is enabled with a desired power setting using the second power control signal (PWR2) of FIG. 2.

In the configuration 140 of FIG. 3B, the transconductance amplifier 102 is enabled and configured as a unity-gain buffer, while the operational amplifier 101 is powered-down and disconnected. Additionally, the current output of the transconductance amplifier 102 drives the capacitor 132, and thus the voltage at the output terminal tracks the voltage of the input terminal (IN) with relatively high precision and with stability. For example, the transconductance amplifier 102 can include a single gain stage for driving the capacitor 121 with robust stability performance due to only one dominant pole at the output terminal.

FIG. 3C is a schematic diagram illustrating a third example configuration 150 of operation of the amplifier system of FIG. 2.

In this example, a resistor 131 and a capacitor 132 are coupled to the output terminal (OUT). Additionally, the first input switch 111, the second input switch 112, the first output switch 113, the second output switch 114, the first feedback switch 115, and the second feedback switch 116 are closed, while the auxiliary input switch 117 is opened.

Furthermore, the operational amplifier 101 is enabled with a desired power setting using the first power control signal (PWR1) of FIG. 2. Additionally, the transconductance amplifier 102 is also enabled with a desired power setting using the second power control signal (PWR2) of FIG. 2. The power settings of the operational amplifier and the transconductance amplifier 102 can be set to desired levels based on a wide variety of considerations, including, but not limited to, values of the resistor 131 and/or capacitor 132. Thus, a drive strength of the operational amplifier 101 can be controlled relative to that of the transconductance amplifier 102 to provide flexibility in suitably driving a particular load.

In the configuration 150 of FIG. 3C, both the operational amplifier 101 and the transconductance amplifier 102 drive the load. Additionally, the operational amplifier 101 operates to reduce or eliminate DC error arising from driving the resistor 131, while the transconductance amplifier 102 operates to maintain stability. Additionally, the power level of each amplifier is set to achieve a desired response for a given load.

Figure 4A:
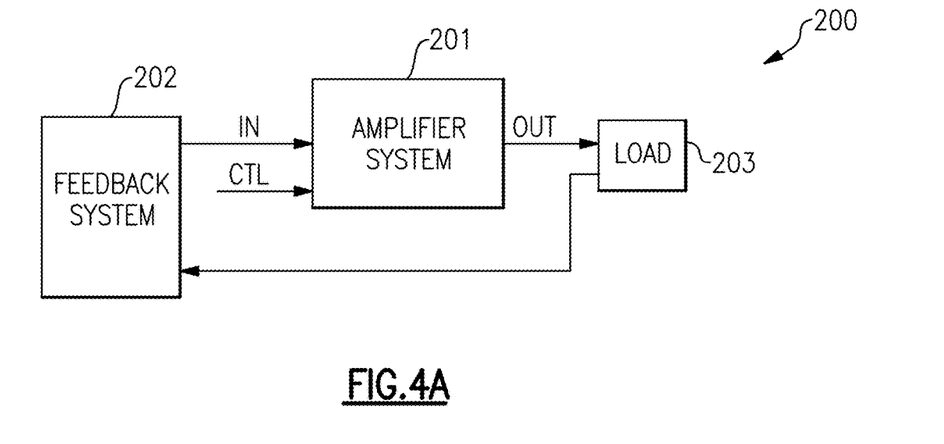
FIG. 4A is a schematic diagram of one embodiment of an electronic system including an amplifier system connected with feedback.

FIG. 4A is a schematic diagram of one embodiment of an electronic system 200 including an amplifier system connected with feedback. The electronic system 200 includes an amplifier system 201, a feedback system 202, and a load 203.

As shown in FIG. 4A, the amplifier system 201 includes an input terminal (IN) that receives an input signal from the feedback system 202. Additionally, the amplifier system 201 includes an output terminal (OUT) that drives the load 203, and a control terminal (CTL) for receiving a control signal for configuring the amplifier system 201. The amplifier system 201 can be implemented in accordance with any of the embodiments herein.

In the illustrated embodiment, the feedback system 202 receives one or more signals indicating a signaling condition of the load 203. Additionally, the feedback system 202 processes the signal(s) to control the input signal to the amplifier system 201.

Although FIG. 4A illustrates one embodiment of an amplifier system with feedback, the teachings herein are applicable to amplifier systems implemented in a wide variety of ways.

Figure 4B:
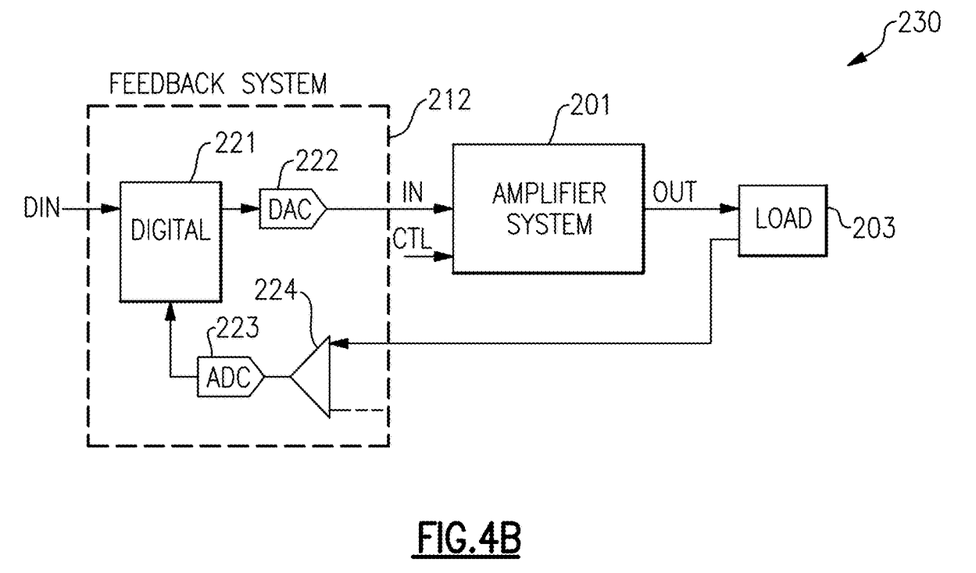
FIG. 4B is a schematic diagram of another embodiment of an electronic system including an amplifier system connected with feedback.

FIG. 4B is a schematic diagram of another embodiment of an electronic system 230 including an amplifier system connected with feedback. The electronic system 230 of FIG. 4B is similar to the electronic system 200 of FIG. 4A, except that the electronic system 230 includes a specific implementation of a feedback system 212.

The feedback system 212 of FIG. 4B includes a digital processing circuit 221, a DAC 222, an ADC 223, and a feedback amplifier 224. The feedback amplifier 224 processes a sensed signal from the load 203 to generate an analog feedback signal. In certain implementations, the feedback amplifier 224 is a voltage gain amplifier. In certain implementations, the feedback amplifier 224 is an instrumentation amplifier.

With continuing reference to FIG. 4B, the analog feedback signal is digitized by the ADC 223 to generate digital input data, which is processed by the digital processing circuit 221 to generate digital output data. In certain implementations, the digital output data is also generated based on a digital input signal (DIN) to the digital processing circuit 221. The DAC 222 processes the digital output data to generate an analog input signal for the amplifier system 201. In this example, the digital processing circuit 221 receives the digital input signal (DIN) for enhancing the range of available processing of the feedback system 212. Additionally or alternatively, an analog input signal is provided, and an ADC digitizes the analog input signal to generate a digital representation suitable for processing by the digital processing circuit 221.

Including the feedback system 212 provides a number of advantages, including, but not limited to, enhanced flexibility in control of feedback over a range of different configurations of the amplifier system 201 and/or different types of the load 203. For example, the digital processing circuit 221 can provide digital integration, digital gain, and/or other desired digital processing to provide a type and/or an amount of feedback desirable for a particular configuration of the amplifier system 201 selected for a particular usage scenario.

The digital processing circuit 221 can be implemented in a wide variety of ways. In certain implementations, the digital processing circuit 221 includes at least one of an FPGA and/or microprocessor for providing a wide variety of types of digital processing.

Figure 5:
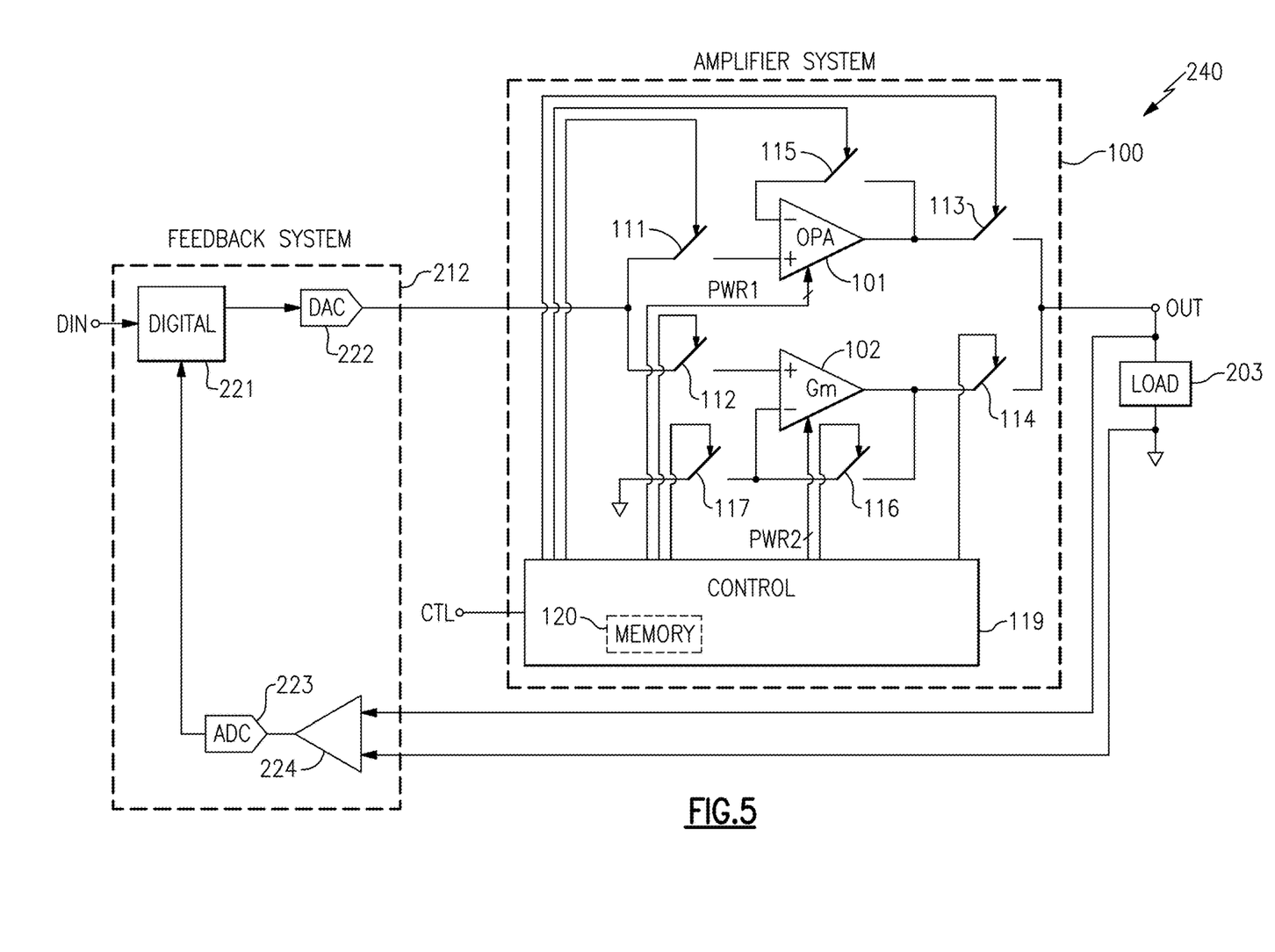
FIG. 5 is a schematic diagram of another embodiment of an electronic system including an amplifier system connected with feedback.

FIG. 5 is a schematic diagram of another embodiment of an electronic system 240 including an amplifier system connected with feedback. The electronic system 240 of FIG. 5 is similar to the electronic system 230 of FIG. 4B, except that the electronic system 240 includes a specific implementation of an amplifier system. In particular, the electronic system 240 includes the amplifier system 100 of FIG. 2.

Figure 6A:
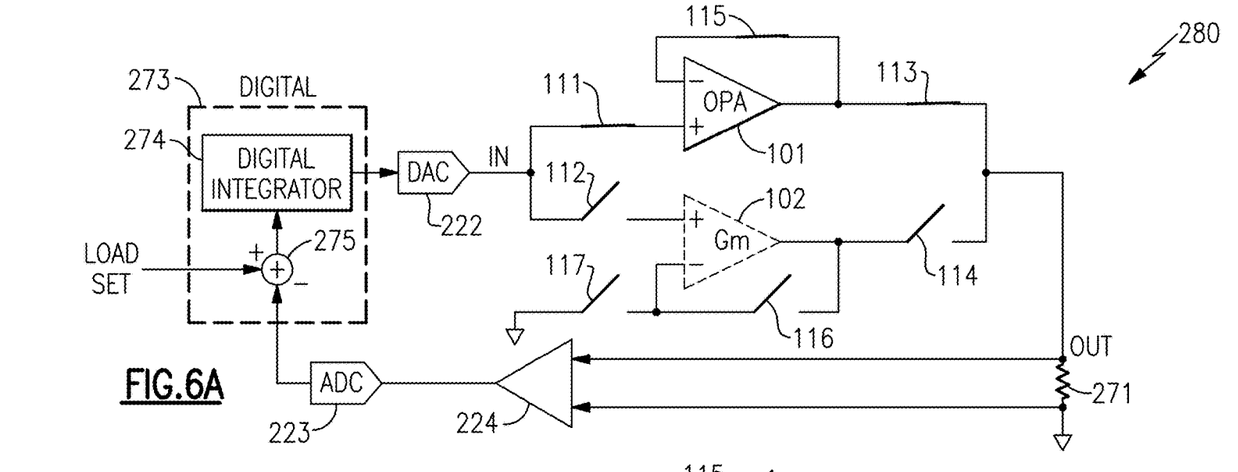
FIG. 6A is a schematic diagram illustrating a first example configuration of operation of the electronic system of FIG. 5.

FIG. 6A is a schematic diagram illustrating a first example configuration 280 of operation of the electronic system 240 of FIG. 5.

In this example, a resistor 271 is coupled to the output terminal (OUT). Additionally, the first input switch 111, the first output switch 113, and the first feedback switch 115 are closed, while the second input switch 112, the second output switch 114, the second feedback switch 116, and the auxiliary input switch 117 are opened. Furthermore, the operational amplifier 101 is enabled with a desired power setting using the first power control signal (PWR1) of FIG. 5. Additionally, the transconductance amplifier 102 is disabled by setting the second power control signal (PWR2) of FIG. 5 to a disabled setting (indicated by a dashed outline of the transconductance amplifier 102).

With continuing reference to FIG. 6A, the configuration 280 operates with example digital processing 273 including a digital integrator 274 and a digital adder 275. The digital adder 275 receives digital load set data, and computes the difference between the digital load set data and digital data from the ADC 223 to generate digital difference data indicating an error between the desired set point and the actual set point at the output terminal. The digital integrator 274 integrates the digital difference data to generate digital integration data. The DAC 222 controls the input signal of the operational amplifier 101 based on the digital integration data.

By configuring the electronic system in this manner, the overall feedback loop of the operational amplifier 101 has high DC gain such that the voltage across the load resistor 271 is accurately set by a voltage level indicated by the digital load set data. Additionally, the digital integrator 274 provides the dominant pole in the electronic system's transfer function to thereby maintain the overall feedback loop stable.

Figure 6B:
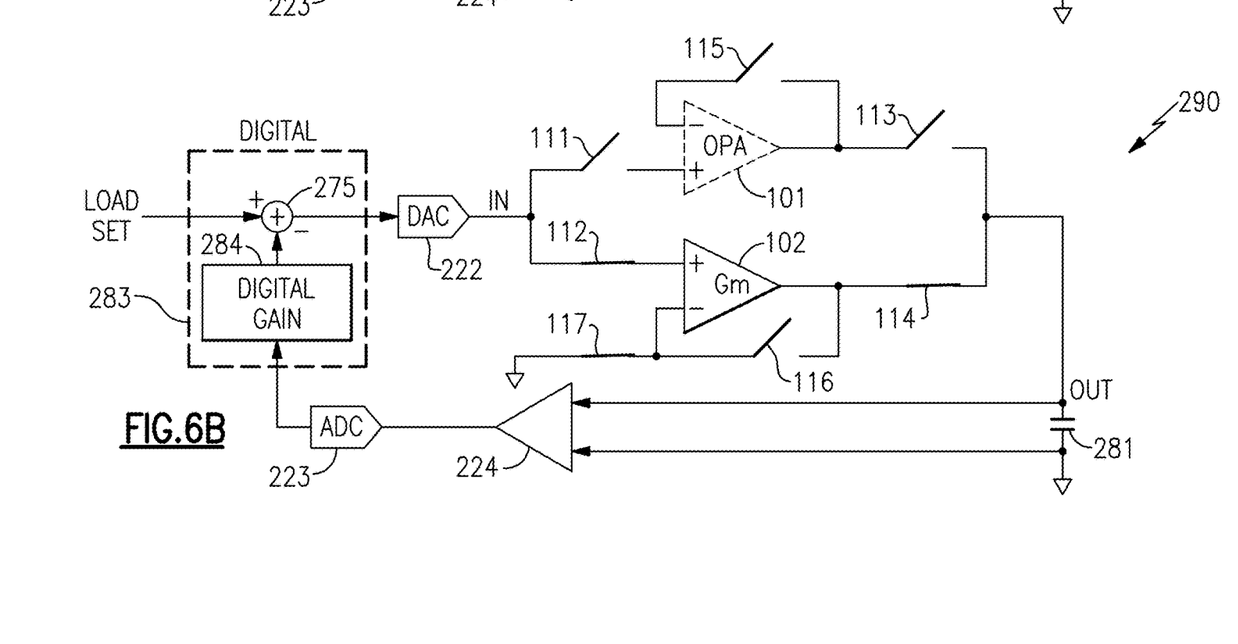
FIG. 6B is a schematic diagram illustrating a second example configuration of operation of the electronic system of FIG. 5.

FIG. 6B is a schematic diagram illustrating a second example configuration 290 of operation of the electronic system 240 of FIG. 5.

In this example, a capacitor 281 is coupled to the output terminal (OUT). Additionally, the first input switch 111, the first output switch 113, the first feedback switch 115, and the second feedback switch 116 are opened, while the second input switch 112, the second output switch 114, and the auxiliary input switch 117 are closed. Furthermore, the operational amplifier 101 is disabled (indicated by a dashed outline of the operational amplifier 101) using the first power control signal (PWR1) of FIG. 5. Additionally, the transconductance amplifier 102 is enabled with a desired power setting using the second power control signal (PWR2) of FIG. 5.

With continuing reference to FIG. 6B, the configuration 290 operates with example digital processing 283 including a digital gain block 284 and a digital adder 275. The digital gain block 284 generates digital amplified data by performing digital computations representing amplification of the digital data from the ADC 223. The digital adder 275 also receives digital load set data, and computes the difference between the digital load set data and the digital amplified data to generate digital output data. The DAC 222 controls the input signal of the transconductance amplifier 102 based on the digital output data.

By configuring the electronic system in this manner, constant digital gain over frequency is provided. Additionally, high DC gain and a dominant pole are provided by the transconductance amplifier 102 driving the load capacitor 281.

Figure 7:
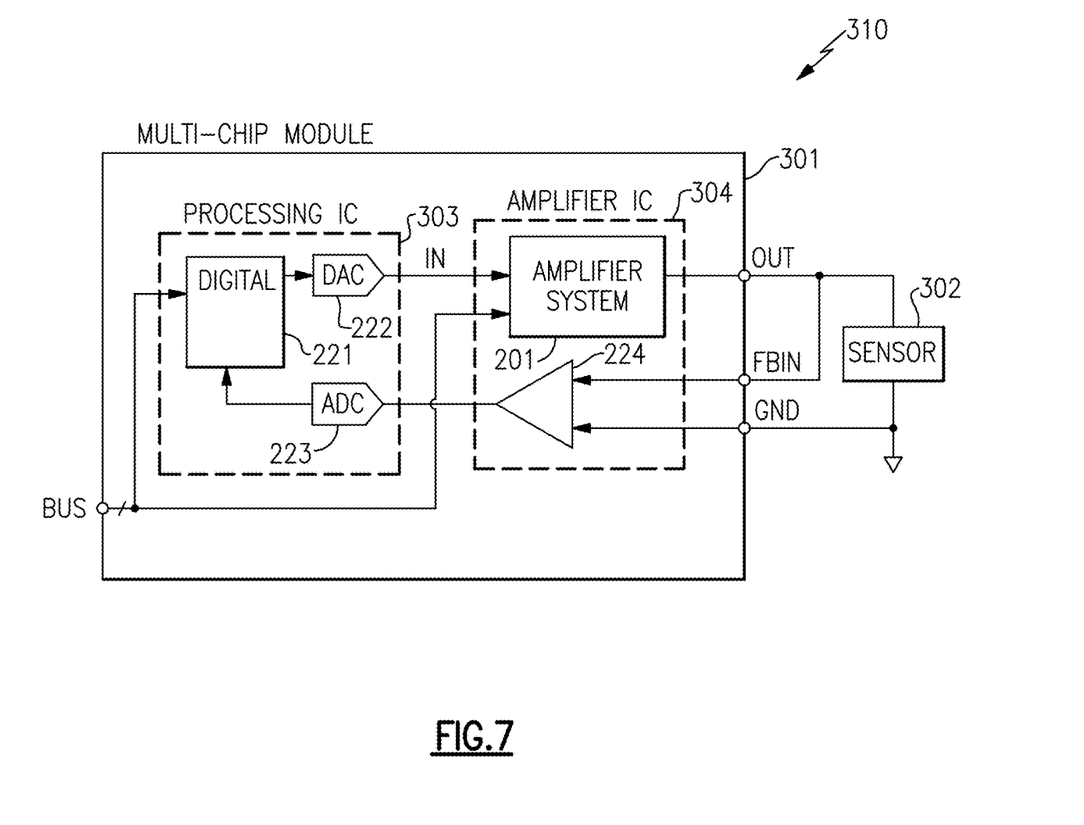
FIG. 7 is a schematic diagram of a multi-chip module according to one embodiment.

FIG. 7 is a schematic diagram of a multi-chip module 310 according to one embodiment. The multi-chip module 310 includes a processing chip 303 and an amplifier chip 304 connected to a module substrate 301. A chip is also referred to herein as a semiconductor die or integrated circuit (IC). Although depicted schematically, the multi-chip module 310 can also include adhesives, solder, encapsulation, surface mount components, additional pins or pads, and/or a wide variety of other structures that have been omitted for clarity of the figures.

The multi-chip module 310 illustrates one example of an electronic module implemented in accordance with the teachings herein. In the illustrated embodiment, the processing chip 303 includes the digital processing circuit 221, the DAC 222, and the ADC 223 fabricated thereon. Additionally, the amplifier chip 304 includes the amplifier system 201 and the feedback amplifier 224 fabricated thereon. The amplifier chip 304 includes an input pin for receiving an input signal from the processing chip 303, and an output pin for coupling to the sensor 302 through an output pin of the multi-chip module 310. The amplifier chip 304 also includes a feedback input pin and a ground pin for receiving a differential feedback signal, which in this example corresponds to a voltage across the sensor 302.

In the illustrated embodiment, the multi-chip module 310 includes an interface or bus (BUS) that is coupled through pins of the dies to the digital processing circuit 221 and amplifier system 201. The bus can be used to program digital data to the processing chip 303 and amplifier chip 304 to achieve a desired configuration of the multi-chip module 310 for a given sensor 302. In certain implementations, the processing IC 303 corresponds to an FPGA and/or microprocessor operable to receive digital data from the bus to control the type of feedback computations performed.

As shown in FIG. 7, the output pin (OUT) of the multi-chip module 310 couples to a first terminal of the sensor 302. In this example, the feedback input pin (FBIN) of the multi-chip module 310 also couples to the first terminal of the sensor 302. However, other implementations are possible, such as implementations using different configurations of feedback. Including an output pin and a separate feedback input pin enhances the flexibility of the multi-chip module 310. In this example, the multi-chip module 310 also includes a ground pin (GND) coupled to a second terminal of the sensor 302. Thus, a voltage across the sensor 302 is provided to the feedback amplifier 224 to thereby monitor signaling conditions of the sensor 302.

The multi-chip module 310 of FIG. 7 is suitable for deployment in a wide range of applications. For example, the multi-chip module 310 can operate in combination with a wide variety of types of sensors, including sensors with varying impedances and/or biasing conditions. Although one example of a multi-chip module is shown, the teachings herein are applicable to a wide variety of types of electronic systems and modules. Accordingly, other implementations are possible.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. An amplifier system with controllable load driving characteristics, the amplifier system comprising:
    an output terminal configured to connect to a load;
    a first output switch and a second output switch;
    a voltage output amplifier having a voltage output electrically connected to the output terminal through the first output switch;
    a current output amplifier having a current output electrically connected to the output terminal through the second output switch; and
    a control circuit configured to control the first output switch to selectively connect the voltage output of the voltage output amplifier to the output terminal, and to control the second output switch to selectively connect the current output of the current output amplifier to the output terminal.

2. The amplifier system of claim 1, wherein the voltage output amplifier is an operational amplifier and the current output amplifier is a transconductance amplifier.

3. The amplifier system of claim 2, wherein the control circuit is operable in a first mode in which the operational amplifier drives the output terminal and the transconductance amplifier is disabled, a second mode in which the transconductance amplifier drives the output terminal and the operational amplifier is disabled, and a third mode in which both the operational amplifier and the transconductance amplifier drive the output terminal.

4. The amplifier system of claim 2, further comprising a first feedback switch controlled by the control circuit and electrically connected between the voltage output and an inverting input of the operational amplifier, and a second feedback switch controlled by the control circuit and electrically connected between the current output and an inverting input of the transconductance amplifier.

5. The amplifier system of claim 2, further comprising an auxiliary input switch controlled by the control circuit and electrically connected between a reference voltage and an inverting input of the transconductance amplifier.

6. The amplifier system of claim 1, wherein the control circuit is further configured to disable the voltage output amplifier when the first output switch is opened, and to disable the current output amplifier when the second output switch is opened.

7. The amplifier system of claim 1, further comprising a first input switch controlled by the control circuit and coupled between an input terminal and an input of the voltage output amplifier, and a second input switch controlled by the control circuit and coupled between the input terminal and an input to the current output amplifier.

8. The amplifier system of claim 7, further comprising a feedback amplifier including an input coupled to the output terminal and an output configured to generate a feedback signal for controlling the input terminal.

9. The amplifier system of claim 1, wherein at least one of the voltage output amplifier or the current output amplifier has an adjustable power level controlled by the control circuit.

10. The amplifier system of claim 1, wherein the control circuit is further configured to receive digital data over an interface, and to control the first output switch and the second output switch based on the digital data.

11. An electronic module with controllable load driving characteristics, the electronic module comprising:
    a module substrate; and
    an amplifier die attached to the module substrate, the amplifier die comprising:
        an output pin configured to provide an output signal to a load;
        a voltage output amplifier;
        a current output amplifier electrically connected in parallel with the voltage output amplifier; and
        a control circuit configured to control the amplifier die to selectively drive the output pin with the voltage output amplifier and to selectively drive the output pin with the current output amplifier.

12. The electronic module of claim 11, wherein the control circuit is operable in a first mode in which the voltage output amplifier drives the output pin and the current output amplifier is disabled, a second mode in which the current output amplifier drives the output pin and the voltage output amplifier is disabled, and a third mode in which both the voltage output amplifier and the current output amplifier drive the output pin.

13. The electronic module of claim 11, further comprising a processing die attached to the module substrate and configured to provide an input signal to an input pin of the amplifier die.

14. The electronic module of claim 13, wherein the amplifier die further comprises a feedback amplifier including an input coupled to the output pin and an output that generates an analog feedback signal.

15. The electronic module of claim 14, wherein the processing die includes an ADC configured to generate digital input data based on the analog feedback signal, a digital processing circuit configured to process the digital input data to generate digital output data, and a DAC configured to generate the input signal based on the digital output data.

16. A method of electronic amplification with controllable load driving characteristics, the method comprising:
    receiving a control signal as an input to an amplifier system, the control signal indicating a selected mode of the amplifier system chosen from a plurality of modes including a first mode, a second mode, and a third mode;
    controlling an output terminal of the amplifier system with a voltage output amplifier in response to the control signal indicating the selected mode is the first mode;
    controlling the output terminal with a current output amplifier in response to the control signal indicating the selected mode is the second mode; and
    controlling the output terminal with both the voltage output amplifier and the current output amplifier in response to the control signal indicating the selected mode is the third mode.

17. The method of claim 16, further comprising disabling the current output amplifier in the first mode, and disabling the voltage output amplifier in the second mode.

18. The method of claim 16, further comprising controlling an adjustable power level of at least one of the voltage output amplifier or the current output amplifier based on the control signal.

19. The method of claim 16, further comprising receiving the control signal as digital data over an interface.

20. The method of claim 16, further comprising controlling an amount of local feedback to at least one of the voltage output amplifier or the current output amplifier based on the control signal.

* * * * *